United States Patent [19]

Kawakita et al.

[11] Patent Number: 5,336,547
[45] Date of Patent: Aug. 9, 1994

[54] ELECTRONIC COMPONENTS MOUNTING/CONNECTING PACKAGE AND ITS FABRICATION METHOD

[75] Inventors: Tetsuo Kawakita, Takatsuki; Takayuki Yoshida, Irakata; Kenzo Hatada, Katano, all of Japan

[73] Assignee: Matsushita Electric Industrial Co. Ltd., Osaka, Japan

[21] Appl. No.: 23,106

[22] Filed: Feb. 26, 1993

[51] Int. Cl.$^5$ .................................................. B32B 9/00
[52] U.S. Cl. ..................................... 428/209; 428/210; 4287312.4; 428/312.8; 428/317.9; 428/546
[58] Field of Search ....................... 428/209, 210, 312.4, 428/312.8, 317.9, 546

[56] References Cited

U.S. PATENT DOCUMENTS

| | | | |
|---|---|---|---|
| 3,642,528 | 2/1972 | Kimura | 428/209 |
| 3,752,702 | 8/1973 | Iizuka et al. | 428/209 |
| 4,564,563 | 1/1986 | Martin et al. | 428/546 |
| 4,595,606 | 6/1986 | St. John et al. | 427/96 |
| 4,701,279 | 10/1987 | Kawaguchi et al. | 252/511 |
| 5,209,967 | 5/1993 | Wright et al. | 428/317.9 |

FOREIGN PATENT DOCUMENTS 2-185050(A) 7/1990 Japan .
2-231437 10/1991 Japan .
4-137630(A) 5/1992 Japan .

*Primary Examiner*—Patrick J. Ryan
*Assistant Examiner*—Kam F. Lee
*Attorney, Agent, or Firm*—Ratner & Prestia

[57] ABSTRACT

The present invention relates to an electronic components mounting/connecting package characterized by using bump electrodes to connect electronic components such as semiconductors and the like with patterning electrodes of a circuit board.

In order to prevent deterioration in connecting reliability due to deformation and the like of semiconductors and circuit boards, it is necessary to have some elasticity incorporated with bump electrodes. The composition of bump electrodes disclosed by the present invention is to have resin particles dispersed to high density in the metallic bump electrodes.

According to this composition, even when there are some variations of distribution in circuit board warp and bump electrode height, it has become possible to absorb the variations through elasticity presented by the bump electrodes and to perform a low strain connection with a resultant enhancement in connecting reliability at high temperature.

4 Claims, 6 Drawing Sheets

ELECTRONIC COMPONENTS MOUNTING/CONNECTING PACKAGE AND ITS FABRICATION METHOD

BACKGROUND OF THE INVENTION

The present invention relates to an electronic components mounting/connecting package for mounting electronic components such as semiconductors and the like on circuit boards or film carriers and its fabrication method.

It has been known for many years to connect bump electrodes of a semiconductor to patterning electrodes of a circuit board by press-bonding with an insulating resin placed between the semiconductor and the circuit board and this has been referred to as a microbump bonding method. With the help of FIG. 12, this microbump bonding method will be explained here.

In FIG. 12(a), item 121 is a circuit board composed of glass, ceramics or the like, item 122 is a patterning electrode formed on the circuit board 121 and item 123 is a drop of a light setting insulation resin placed at a position on the circuit board where an LSI chip is to be mounted. Then, as illustrated in FIG. 12(b), a bump electrode 126 formed on an aluminum electrode 125 of the LSI chip 124 is aligned in position with the patterning electrode 122. The bump electrode 126 has been so far comprised of such a metallic material as gold, solder or the like and has been formed on the aluminum electrode 125 of the LSI chip 124 either directly by an electrolytic plating method or through a transferring method whereby metal bumps formed on a separate metal substrate are transferred to the surface of the aluminum electrode 125 of the LSI chip 124.

In the next, as illustrated in FIG. 12(c), the LSI chip 124 is applied with a pressing force through a pressure application tool 127. Then, the insulation resin 123 under the bump electrode 124 is completely put aside towards the periphery and the bump electrode 124 is compressed to complete an electrical connection with the patterning electrode 122. Then, ultraviolet rays 128 are irradiated for curing the light setting insulation resin 123, as shown in FIG. 12(d). At this time, when the circuit board is formed of a transparent material such as glass, etc., the ultraviolet rays are irradiated from the back side of the circuit board 121 and when the circuit board is not transparent, the ultraviolet ray irradiation is applied from the side where the LSI chip 124 is mounted. When curing of the resin is finished and the pressure application tool 127 is removed, the connection between the LSI chip 124 and the circuit board 121 will be finally completed, as shown in FIG. 12(e).

However, the aforementioned method of the prior art has a few problems as in the following:

1) As the number of connecting pins increases, their weight becomes so large as to make the semiconductor and the circuit board liable to deform, leading to deterioration in connection reliability and sometimes to causing a damage to the semiconductor itself.

2) The pressure application to from tens to hundreds of electrodes formed on semiconductors has to be performed uniformly and a very high accuracy has to be realized in flatness on both of the pressure application tool and the opposing surface of the circuit board and the degree of the accuracy required will be increasing as the number of the connecting pins increases and the chip size becomes large, resulting in difficulties to meet the requirement. Even a small variation in height distribution of the bump electrodes, by 3 to 5 um for example, or a slight warp of the circuit board will be causing failures in connection.

3) Also, when the semiconductors are turned on to operate, the heat generated from the semiconductors tends to bring about straining and warping to the materials used due to differences in thermal expansion coefficient, consequently leading again to failures in connection between the bump electrodes and the circuit board electrodes.

The connection failures as described in the foregoing take place not only with the microbump bonding method but also with the flip-chip bonding method that uses solder bumps.

SUMMARY OF THE INVENTION

The object of the present invention is to disclose an electronic components mounting/connecting package having improved connecting reliability, realized through elasticity incorporated with bump electrodes which make a key factor in connecting semiconductor electrodes with circuit board electrodes and its fabrication method.

The elasticity was provided to the bump electrodes by having resin particles diffused into metal which composes the bump electrodes. As a result, the bump electrodes having elasticity are compressed to ensure a good connection even when there exist variations in the bump electrode height and warps in the circuit board.

DETAILED DESCRIPTION OF THE INVENTION

Figure 1:
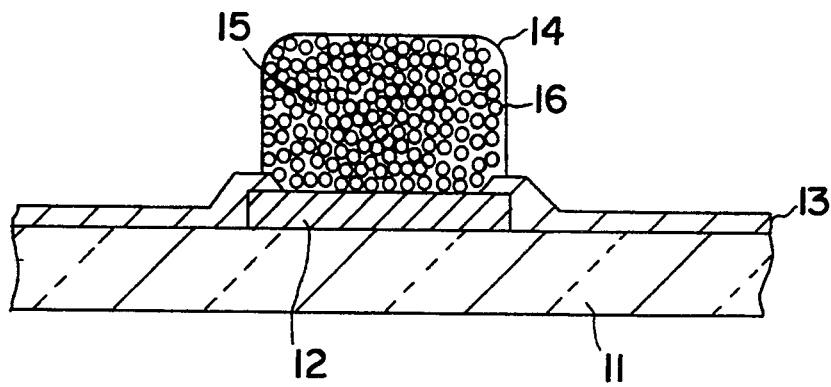
FIG. 1 is a cross-sectional view of the electronic components mounting/connecting package as described in Example 1 of the present invention's embodiments.

FIG. 1 is a cross-sectional view of an electronic components mounting/connecting package as described in an embodiment of the present invention. In FIG. 1, item 11 is an LSI chip, item 12 is an aluminum electrode, item 13 is an insulating layer formed of $SiO_2$ or the like, and item 14 is a bump electrode formed on the aluminum electrode 12. The present invention is characterized by having said bump electrode 14 comprised of a metal layer 15, wherein resin particles 16 were dispersed. The metal layer 15 is comprised of gold, copper, solder or the like and the resin particle 16 is comprised of a resin of acrylic system, styrene system or silicon system ranging from 1 to 5 um in diameter.

Figure 2:
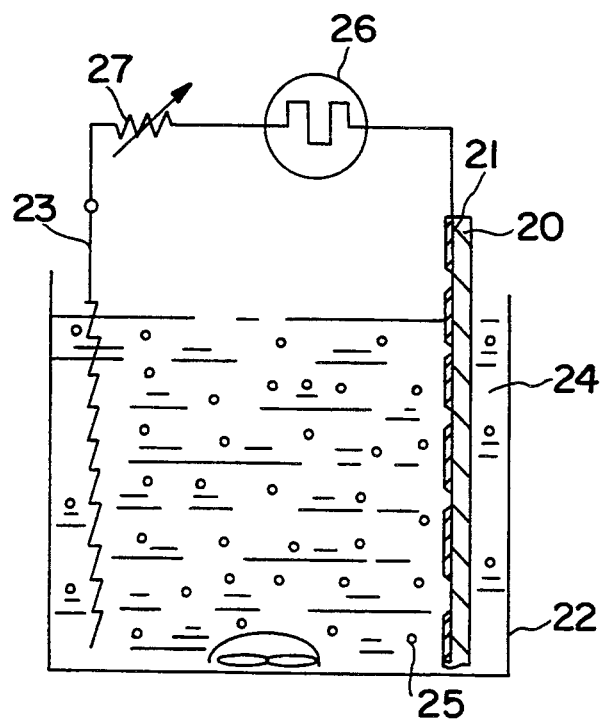
FIG. 2 is a schematic illustration of the method to fabricate the electronic components mounting/connecting package shown in FIG. 1.
Figure 3:
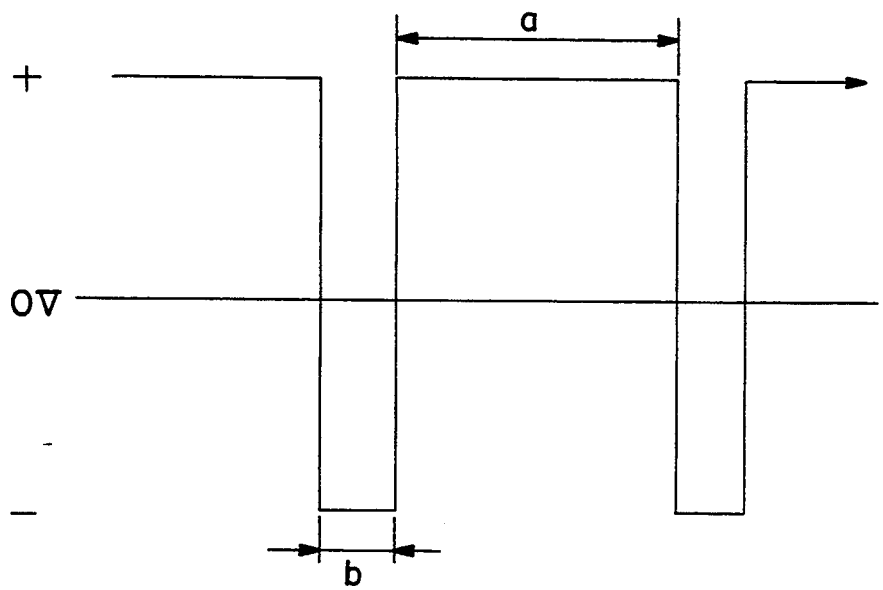
FIG. 3 shows pulse waveforms of the supply source voltage as used in FIG. 2.

FIG. 2 is a schematic illustration to show how the bump electrode 14 is formed on the aluminum electrode 12. The bump electrode 14 is usually formed on the aluminum electrode 12 with a barrier-metal placed in between. Therefore, the aluminum electrode 12 was first pattern-formed on the LSI chip 11 and then a barrier-metal layer was formed over the entire surface of the LSI chip 11. Ti/Pd/Au, Cr/Au or the like was used as the barrier metal and thickness of the barrier metal layer ranged from 0.1 to 0.3 um. Photoresist was coated over the barrier-metal layer to the thickness of 0.8 to 1.5 um with an opening portion formed at a position corresponding to that of the aluminum electrode 12. electrode 12. An LSI chip 20, on which a photoresist layer 21 serving as a plating mask, had been formed was immersed to the position opposite to a counter electrode 23. A gold plating solution 24 dispersed with resin particles 25 was contained in a plating tank 22. Across the LSI chip and the opposing electrode 23, a pulse voltage supply source 26 and a potentiometer 27 were connected in series. As the gold plating solution 24, a non-cyanic system solution was used and as the resin particles 25, polystyrene particles were used. Over the foremost surface of each respective resin particle 25 are formed $OH^-$ radicals upon immersing the polystyrene particles in the solution. Therefore, when a positive potential is applied to the LSI chip 20, the $OH^-$ radicals will be attracted by and attached to the LSI chip 20. On the other hand, since gold ions in the gold plating solution 24 are positive ions, the gold ions will be attracted by and deposited on the LSI chip 20 upon application of a negative potential to the LSI chip 20. Therefore, when an electric plating is performed through an application of a pulse waveform voltage as shown in FIG. 3, a step of depositing polystyrene particles and a step of depositing gold will take place alternatingly. As a result, a bump electrode 14 with resin particles 16 comprised of polystyrene particles dispersed in a metal layer 15 comprised of gold will be formed as shown in FIG. 1. The pulse frequency used in the foregoing ranged from hundreds n sec. to hundreds m sec. The ratio of the positive voltage application period a to the negative voltage application period b was desired to range from 1:1 to 9:1. In practice, for example, while the gold plating solution 24 was constantly stirred to disperse the resin particles 25 uniformly, a pulse frequency of 1 m sec. accounted for by 900 n sec. of a and 100 n sec. of b, a temperature of the plating solution 24 ranging from 60° to 65° C. and a plating current density I adjusted by the potentiometer 27 to I=0.04 $mA/mm^2$ were used in the plating process that lasted for about 80 minutes. As a result, a bump electrode 14 having a height of around 10 μm was formed.

Then, after the photoresist 21 was removed and the bump electrode 14 only was again coated by photoresist for protection, all the barrier metal layer except for the region of the bump electrode 14 was etched off. After this barrier metal etching, the photoresist on the bump electrode 14 was removed and the bump electrode 14 as shown in FIG. 1 was obtained.

Figure 4:
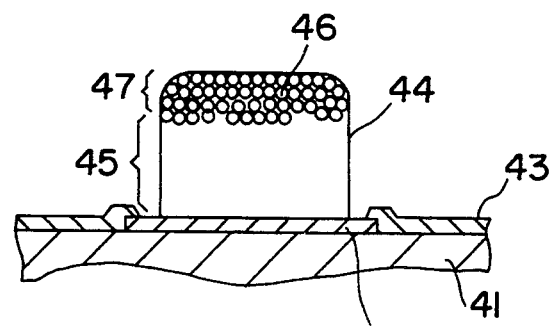
FIG. 4 is a cross-sectional view of the electronic components mounting/connecting package as described in Example 2 of the present invention's embodiments.
Figure 5:
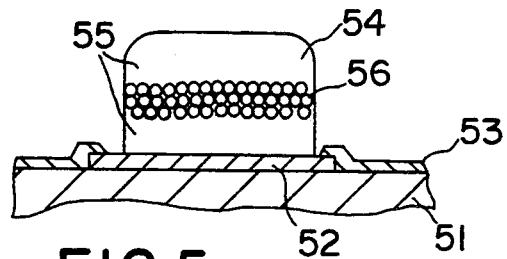
FIG. 5 is a cross-sectional view of the electronic components mounting/connecting package as described in Example 3 of the present invention's embodiments.

Example 2 of the present invention's embodiments is illustrated in FIG. 4. Items 41, 42 and 43 are, respectively, an LSI chip, an aluminum electrode and an insulating layer comprised of $SiO_2$, etc., in the same way as were in FIG. 1. Example 2 is characterized by an integrated composition of a bump electrode 44 comprising a first metal layer 45 and a second metal layer 47 wherein resin particles 46 are dispersed. The order of integration between the first and second metal layers can be reversed. Also, as shown in FIG. 5, the composition of a bump electrode 54 can be made to have resin particles 56 sandwiched between two metal layers 55. Here, items 51, 52 and 53 are an LSI chip, an aluminum electrode and an insulating layer, respectively. The material of the foregoing metal layer can be solder, silver, copper, indium, etc., besides gold, as long as they are receptive to electro-plating and can also be a combination of them. The method of forming such bump electrodes as above is to use the same plating equipment as shown in FIG. 2 and, in addition, to use another plating equipment wherein no resin particles are dispersed. In other words, when the bump electrode 44 of FIG. 4 is to be formed, the first metal layer 45 should be formed first by means of a plating equipment with no resin particles dispersed. In this case, the height of the first metal layer 45 should be made to range from 5 to 20 μm since the total height of the bump electrode 44 is somewhere from 10 to 30 μm. Then, the second metal layer 47 with resin particles 46 contained by dispersion will be formed to the thickness of 5 to 10 μm by means of a metal plating tank dispersed with resin particles 46 and applied with pulse voltages.

In the case of FIG. 5 also, a lower metal layer 55 is first formed to the thickness of 1 to 10 μm and, then, a metal layer containing resin particles 56 is formed to the thickness of 2 to 10 μm. Finally, an upper metal layer 55 is formed to the thickness of 1 to 10 μm.

Relative to the method of forming the bump electrode having the aforementioned compositions on an aluminum electrode, there is a method of having the bump electrode only formed once on a separate substrate and then moved onto the aluminum electrode by a transfer method. This method will be described in the following with the help of FIG. 6;

An electro-conducting layer 62 is to be formed on all over an insulating layer 61. The insulating layer 61 is comprised of ceramics, glass, etc. and the electro-conducting layer is comprised primarily of Pt, ITO, etc. Then, an insulating layer to make a plating mask 63 is formed all over the electro-conducting layer 62. In the next, opening portions 64 are formed at positions on the plating mask corresponding to the positions of semiconductor electrodes by means of a lithography technology. Non-organic thin films ranging from 300 nm to 1000 nm in thickness formed of $SiO_2$, $Si_3N_4$, etc. by means of a plasma CVD method are usually used as the foregoing plating mask 63. After the opening portions 64 are formed, bump electrodes 65 are to be formed on the insulating layer 61 according to the same method as described before.

Figure 6:
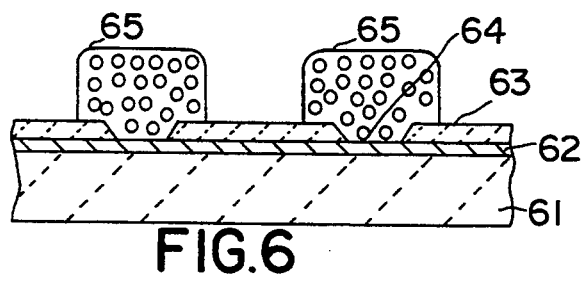
FIG. 6 is a cross-sectional view of a separate substrate, whereupon bump electrodes were formed for making bump electrodes by a transfer method.
Figure 7A:
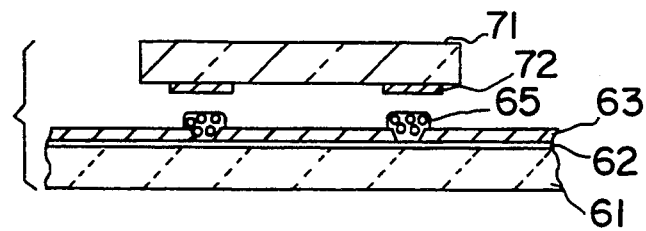
FIGS. 7(a)–7(c) show a series of cross-sectional views illustrating how the bump electrodes of FIG. 6 are transferred onto semiconductor electrodes.
Figure 7B:
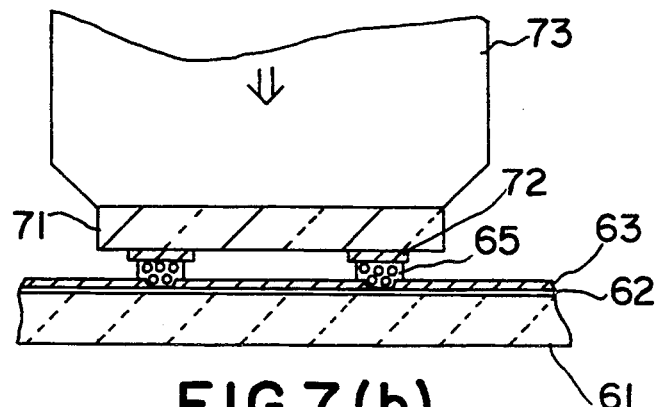
Figure 7C:
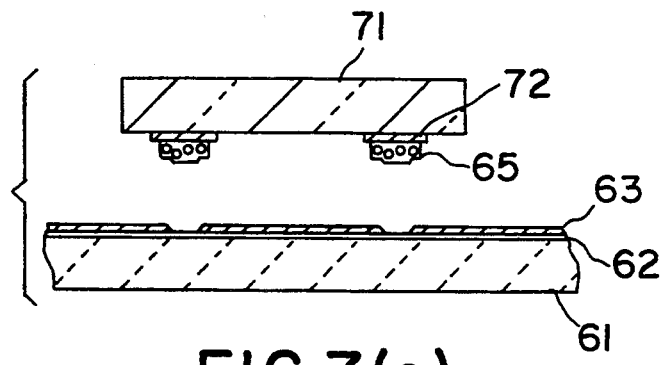

In the next, how to transfer the bump electrode 65 as shown in FIG. 6 to the surface of an aluminum electrode 72 formed on an LSI chip 71 will be described with the help of FIG. 7. First, as illustrated in FIG. 7(a), the bump electrode 65 formed on the insulating substrate 61 as shown in FIG. 6 is aligned in position with the aluminum electrode 72 of the LSI chip 71. Then, as shown in FIG. 7(b), the bump electrode 65 is compressed by means of a pressure application tool 73 and joined with the aluminum electrode 72 through a heat application. When the pressure application tool 73 is removed, the bump electrode 65 has been transferred onto the aluminum electrode 72, as shown in FIG. 7(c).

Thus, a metallic bump electrode mixed by dispersion with resin particles can be formed on the aluminum electrode of an LSI chip.

Figure 8A:
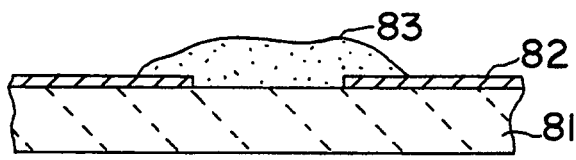
FIGS. 8(a)–8(e) show a series of cross-sectional views illustrating how an electronic components mounting/connecting package of the present invention is connected to a circuit board.

The connection between an LSI chip with bump electrodes formed according to the foregoing method and a circuit board can be performed in the same manner as with the prior art. FIG. 8 illustrates an example of such connecting methods. In FIG. 8(a), item 81 is a circuit board and item 82 is a patterning electrode. A light setting insulation resin 83 was coated over the circuit board 81 in the areas where LSI chips are mounted. The circuit board 81 was comprised of glass or ceramics and the light setting insulation resin 83 was comprised of a resin of epoxy system, acrylic system, silicon system or the like.

Figure 8B:
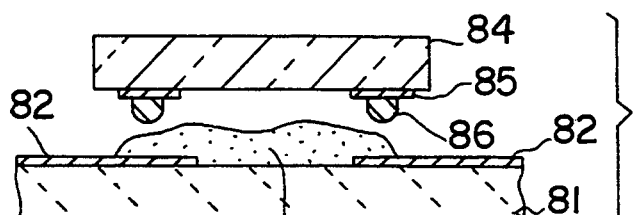
Figure 8C:
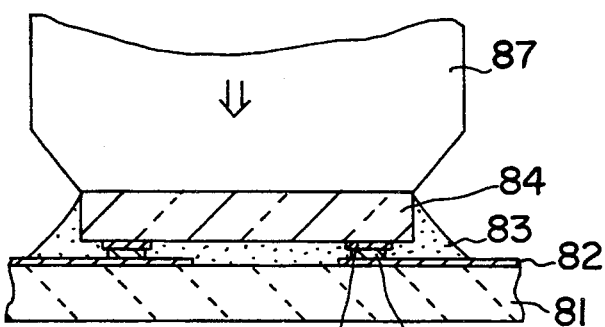
Figure 8D:
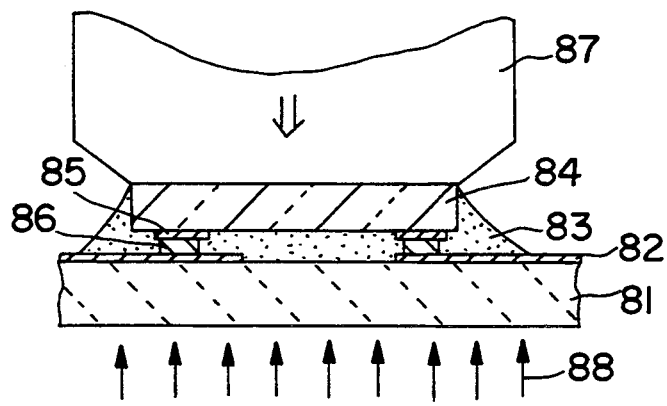
Figure 8E:
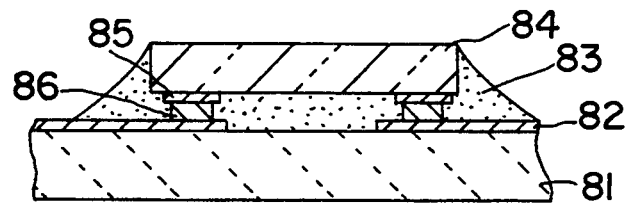

Then, as shown in FIG. 8(b), a metallic bump electrode 86 formed on the aluminum electrode 85 of an LSI chip 84 was aligned in position with a patterning electrode 82 of the circuit board 81 and then compressed by means of a pressure application tool 87. At this time, the insulation resin 83 was stretched out to the periphery of the LSI chip 84. The magnitude of the pressing force applied here was large enough to cause an elastic deformation, falling short of causing a complete non-elastic deformation, to the resin particles contained by dispersion in the bump electrode 86. In other words, the pressing force was set to a magnitude whereby the volume of the bump electrode 86 was compressed by 5 to 20%. After the light setting insulation resin 83 was irradiated by an ultraviolet ray 88 for curing as shown in FIG. 8(c), the applied pressure was removed. As a result, the LSI chip 84 was fixed on the circuit board 81 and the bump electrode 86 formed on the aluminum electrode 85 of the LSI chip 84 was kept in contact with the circuit board 81 for completion of electrical connection as shown in FIG. 8(e). When the circuit board 81 is formed of a transparent material like glass, the ultraviolet ray 88 can be irradiated from the back side of the board for curing the light setting insulation resin 88 as shown in FIG. 8(d) and in case where a non-transparent material like ceramics is used as the circuit board, the ultraviolet ray is to be irradiated from the side of the LSI chip.

Figure 9:
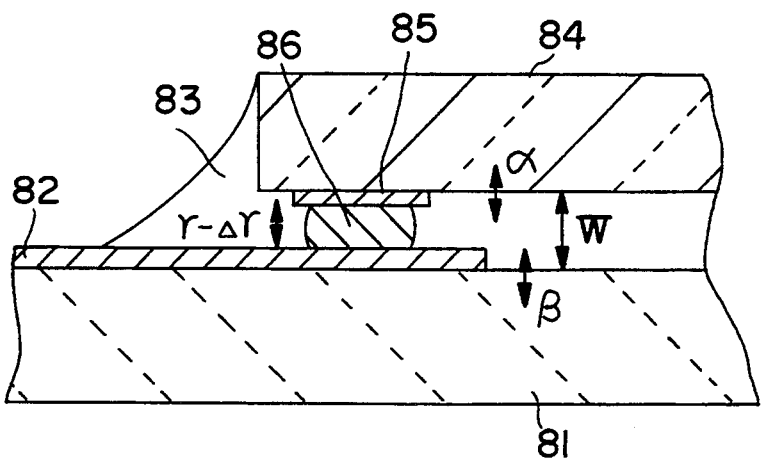
FIG. 9 shows the principle whereby the connection illustrated in FIGS. 8(a)–8(c) is performed.

As a result of experiments, even when the distance between the LSI chip 84 and the patterning electrode 82 changed by as much as 2 $\mu$m. it was confirmed that a good connection was being maintained. Also, when the variation in height of the patterning electrodes 82 stays within a limit of 2 $\mu$m, this much variation can be absorbed by the metallic bump electrode 86 without causing any adverse effect to the electrical connection. A theoretical analysis of what is happening in this connecting mechanism will be made in the following with the help of FIG. 9:

A contractile force W of the light setting insulation resin 83, an adhesive force a existent between the LSI chip 84 and the light setting insulation resin 83 and an adhesive force B existent between the circuit board 81 and the light setting insulation resin 83 are exerted on the LSI chip 84 and the circuit board 81. As a result, the bump electrode 86 and the patterning electrode 82 are compressed and kept in contact with each other. Further, the resin particles contained in the bump electrode 86 are deformed elastically by a mechanical pressure applied at the time of connecting process and the height g of the bump electrode 86 is changed by g and kept that way.

Figure 10:
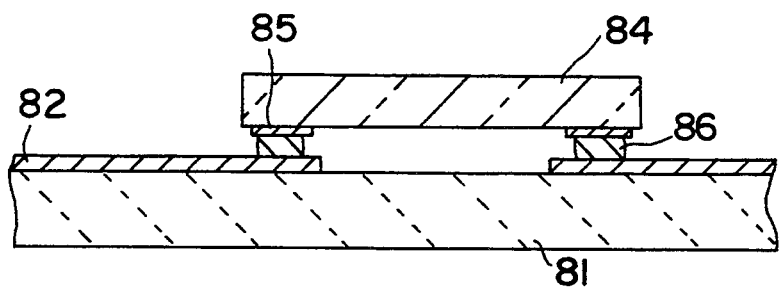
FIG. 10 shows how a semiconductor is connected to a circuit board without using any insulating resin.

In addition, as shown in FIG. 10, the metallic bump electrode 86 on the aluminum electrode 85 of the LSI chip 84 can be directly mounted on the circuit board 81. In this case, the metallic material composing the bump electrode 86 needs to be solder, tin or the like.

Figure 11:
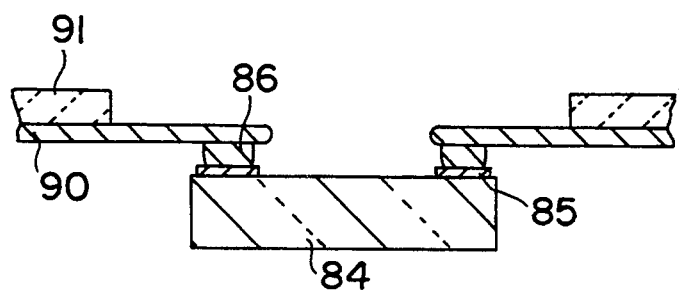
FIG. 11 shows how a connection between a film carrier and a semiconductor is performed.
Figure 12A:
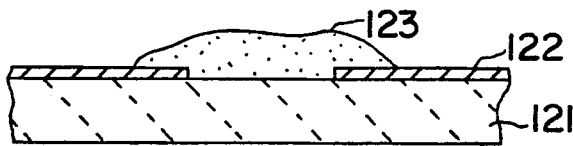
FIGS. 12(a)–12(e) a series of cross-sectional views illustrating how a semiconductor is connected to a circuit board according to the prior art.
Figure 12B:
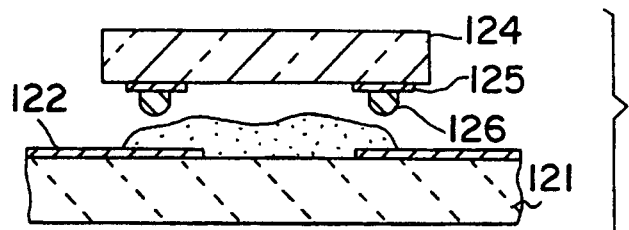
Figure 12C:
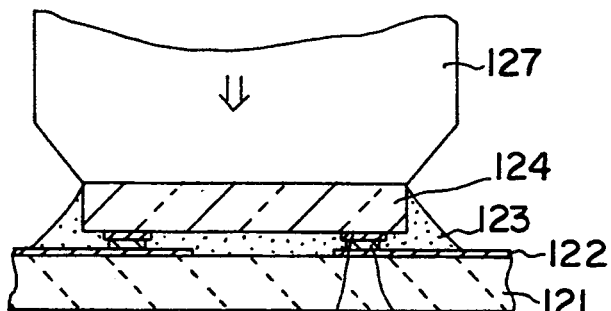
Figure 12D:
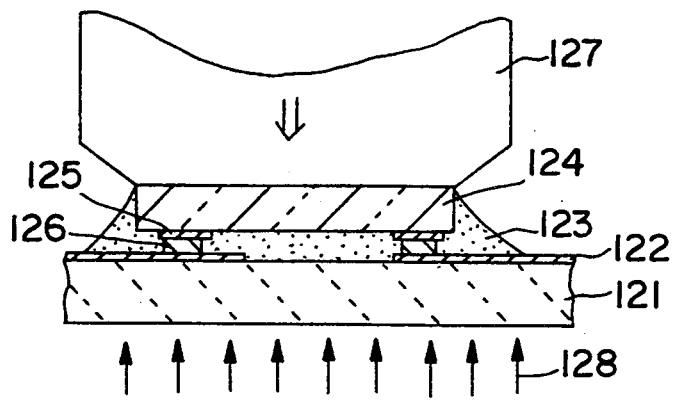
Figure 12E:
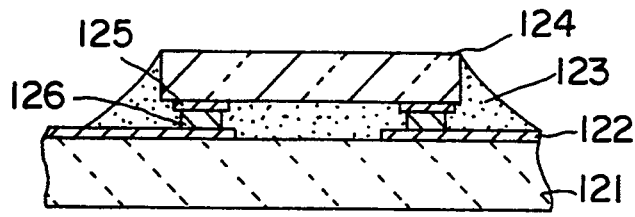

Besides, as shown in FIG. 11, the metallic bump electrode 86 can be used in connecting the LSI chip 84 to a lead 91 of a film carrier 90, serving as a mounting/packaging means.

The composition of the metallic bump electrode wherein resin particles are dispersed, as disclosed by the present invention, presents the effects as described in the following:

1) An electrical connecting process of an LSI chip can be performed without incurring a much pressing force to the LSI chip since the metallic bump electrodes provided with elasticity serve as a buffer against the mechanical pressure caused during the connecting process. Even when an LSI chip having many electrodes goes through a connecting process, it has become possible to carry out a small strain force connection, resulting in a reduction of the damages inflicted upon the LSI chip at the time of connection and a contribution to enhancing greatly the reliability involved with connection.

2) When a thermal strain (thermal expansion) is exerted to a light setting insulation resin due to the heat generation brought about by an activated LSI chip and an increase in the ambient temperature, the metallic bump electrode and the circuit board electrode are liable to separate from each other. However an elastic force existent within the metallic bump electrodes is able to keep a good contact between the LSI chip and the patterning electrodes of the circuit board. When the elastic recovery capability of the metallic bump electrode used in the present embodiment examples is expressed in terms of the bump electrodes deformation, its limit is about 3 um in maximum. Besides, the light setting insulation resin expands only by 1 to 2 um at 200° C. Consequently, a very stable connection can be realized under the conditions ranging from a low temperature region to a high temperature region.

3) According to several prior art methods, it has been necessary to accurately control the flatness of the pressure application tool and also the circuit board and a variation in the height distribution of the metallic bump electrodes existing within a chip surface. However, according to the present invention, a variation of 3 um or so in the flatness and the height as well has been made absorbable by the elasticity incorporated with the metallic bump electrode. Therefore, when an LSI chip is mounted on a circuit board directly or by means of a film carrier, more freedom in selecting a circuit board has become available and the connecting process performed under a low pressing force imposed on the LSI chip has eliminated a danger of warping or straining of the chip package with a resultant enhancement of connecting reliability.

4) The method of forming a metallic bump electrode as disclosed by the present invention can use the same electroplating process as the conventional constant current electro-plating except for using a pulsated voltage and dispersing fine resin particles into the plating solution and can fabricate readily a metallic bump electrode wherein resin particles are dispersed into a metal to a high density.

What is claimed is:

1. An electronic components mounting/connecting package comprising bump electrodes of a composition wherein resin particles having diameters in the range of 1-5 $\mu$m are dispersed in metal.

2. An electronic components mounting/connecting package comprising bump electrodes each comprising alternate lamination of a metallic layer and a mixed composition layer wherein resin particles having diameters in the range of 1-5 $\mu$m are dispersed in metal.

3. An electronic components mounting/connecting package comprising bump electrodes of a two layer construction consisting of a metallic layer and a mixed composition layer wherein resin particles having diameters in the range of 1-5 $\mu$m are dispersed in metal.

4. An electronic components mounting/connecting package comprising bump electrodes of a three layer construction consisting of a sequential lamination of a first metallic layer, a mixed composition layer wherein resin particles having diameters in the range of 1-5 $\mu$m are dispersed in metal and a second metallic layer.

* * * * *